US011195705B2

(12) United States Patent
Galstyan et al.

(10) Patent No.: US 11,195,705 B2
(45) Date of Patent: Dec. 7, 2021

(54) PLASMA GENERATING UNIT AND SUBSTRATE TREATING APPARATUS COMPRISING THE SAME

(71) Applicant: SEMES CO., LTD., Chungcheongnam-do (KR)

(72) Inventors: Ogsen Galstyan, Chungcheongnam-do (KR); Junghwan Lee, Gyeonggi-do (KR); Jong Hwan An, Gyeonggi-do (KR); Shin-Woo Nam, Yongin-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 260 days.

(21) Appl. No.: 15/937,922

(22) Filed: Mar. 28, 2018

(65) Prior Publication Data

US 2018/0286641 A1 Oct. 4, 2018

(30) Foreign Application Priority Data

Mar. 29, 2017 (KR) .................. 10-2017-0039678

(51) Int. Cl.
*H01J 37/32* (2006.01)
*H01L 21/67* (2006.01)
*H01F 27/28* (2006.01)

(52) U.S. Cl.
CPC ........ *H01J 37/32651* (2013.01); *H01F 27/28* (2013.01); *H01J 37/3211* (2013.01);
(Continued)

(58) Field of Classification Search
CPC ............. H01J 37/32651; H01J 37/3211; H01J 37/3244; H01J 2237/334; H01J 37/32642;
(Continued)

(56) References Cited

U.S. PATENT DOCUMENTS 5,683,548 A * 11/1997 Hartig .................. C23C 16/507
438/729
5,795,429 A * 8/1998 Ishii ........................ H05H 1/46
118/723 I (Continued)

FOREIGN PATENT DOCUMENTS

EP 0792947 A2 9/1997
JP 2000091320 A 3/2000
(Continued)

OTHER PUBLICATIONS

China Patent Office, Office action dated Nov. 2, 2020.

*Primary Examiner* — Ram N Kackar
(74) *Attorney, Agent, or Firm* — Li & Cai Intellectual Property (USA) Office

(57) ABSTRACT

Disclosed are a plasma generating unit and a substrate treating apparatus including the same. The substrate treating apparatus includes a process chamber having a treatment space in the interior thereof, a substrate support unit configured to support a substrate in the treatment space, a gas supply unit configured to supply a process gas into the treatment space, and a plasma generating unit disposed outside the process chamber and configured to generate plasma from the process gas in the process chamber, wherein the plasma generating unit includes an antenna unit including a plurality of antenna coils configured to generate plasma from the process gas, and a magnetic structure including magnetic walls disposed between the plurality of antenna coils, and wherein the antenna unit includes a first antenna coil having a ring shape, and a second antenna coil disposed outside the first antenna coil and having a ring shape.

17 Claims, 7 Drawing Sheets

(52) U.S. Cl.
CPC .... *H01L 21/67069* (2013.01); *H01J 37/3244* (2013.01); *H01J 37/32642* (2013.01); *H01J 2237/334* (2013.01)

(58) Field of Classification Search
CPC ................ H01J 37/32669; H01F 27/28; H01L 21/67069
See application file for complete search history.

(56) References Cited

U.S. PATENT DOCUMENTS

| | | |
|---|---|---|
| 6,463,875 B1 | 10/2002 | Chen et al. |
| 8,444,870 B2 * | 5/2013 | Godyak .................. H05H 1/46 216/68 |
| 2004/0255864 A1 | 12/2004 | Jeon et al. |
| 2006/0075967 A1 | 4/2006 | Lu et al. |
| 2010/0136262 A1 | 6/2010 | Godyak |
| 2013/0105086 A1 * | 5/2013 | Banna ..................... H05H 1/46 156/345.38 |
| 2013/0278142 A1 | 10/2013 | Dorf et al. |
| 2016/0225590 A1 | 8/2016 | Aubuchon et al. |

FOREIGN PATENT DOCUMENTS

| | | |
|---|---|---|
| JP | 2011138712 A | 7/2011 |
| JP | 2015220352 A | 12/2015 |
| KR | 1020070009393 A | 1/2007 |
| KR | 10-2007-0020798 A | 2/2007 |
| KR | 10-2014-0042624 A | 4/2014 |
| KR | 10-2015-0130647 A | 11/2015 |
| TW | 373226 B | 11/1999 |

\* cited by examiner

PLASMA GENERATING UNIT AND SUBSTRATE TREATING APPARATUS COMPRISING THE SAME

CROSS-REFERENCE TO RELATED APPLICATIONS

A claim for priority under 35 U.S.C. § 119 is made to Korean Patent Application No. 10-2017-0039678 filed on Mar. 29, 2017, in the Korean Intellectual Property Office, the entire contents of which are hereby incorporated by reference.

BACKGROUND

Embodiments of the inventive concept described herein relate to a plasma generating unit and a substrate treating apparatus comprising the same.

Plasma refers to an ionized gaseous state including ions, electrons, and radicals. The plasma is generated by very high temperature, strong electric fields, or radio frequency (RF) electromagnetic fields. In the semiconductor device manufacturing process, an etching process is performed by using plasma. The etching process is performed when ion particles contained in plasma collides with a substrate.

The plasma unit for generating plasma includes a capacitively coupled plasma (CCP) type plasma generating unit that uses upper and lower electrodes in a chamber, and an inductively coupled plasma (ICP) type plasma generating unit that uses coils installed inside or outside the chamber.

FIG. 1 is a sectional view illustrating a substrate treating apparatus 1 including an ICP type plasma generating unit. As illustrated in FIG. 1, the existing plasma generating unit 3 may include a plurality of coils 4 for inducing an electromagnetic field. However, in this case, distribution of electric power to the plurality of coils cannot be predicted due to an influence of mutual coupling of the coils, and accordingly, the density of the plasma cannot be uniformly formed.

SUMMARY

Embodiments of the inventive concept provide a plasma generating unit that may reduce an influence due to mutual coupling of a plurality of coils provided in the plasma generating unit and may independently control the coils, and a substrate treating apparatus comprising the same.

The objects of the inventive concept are not limited to the above-described ones. Other technical objects that are not mentioned will be clearly understood from the following description by those skilled in the art to which the inventive concept pertains.

In accordance with an aspect of the inventive concept, there is provided a substrate treating apparatus comprising a process chamber having a treatment space in the interior thereof, a substrate support unit configured to support a substrate in the treatment space, a gas supply unit configured to supply a process gas into the treatment space, and a plasma generating unit disposed outside the process chamber and configured to generate plasma from the process gas in the process chamber, wherein the plasma generating unit comprises an antenna unit including a plurality of antenna coils configured to generate plasma from the process gas, and a magnetic structure including a magnetic wall disposed between the plurality of antenna coils, and wherein the antenna unit comprises a first antenna coil having a ring shape, and a second antenna coil disposed outside the first antenna coil and having a ring shape.

An upper end of the magnetic wall may be higher than upper ends of the antenna coils.

The magnetic structure may comprise a first magnetic wall disposed to be closer to the first antenna coil than to the second antenna coil, and a second magnetic wall disposed to be closer to the second antenna coil than to the first antenna coil, and the first magnetic wall and the second magnetic wall may be disposed between the first antenna coil and the second antenna coil.

An upper end of the first magnetic wall may be higher than an upper end of the first antenna coil. An upper end of the second magnetic wall may be higher than an upper end of the second antenna coil.

The first antenna coil and the second antenna coil may be provided at the same height, and the first magnetic wall and the second magnetic wall may be provided at the same height.

The magnetic walls may have a ring shape.

central axes of the magnetic walls and central axes of the antenna coils may be the same.

The heights of the magnetic walls may be more than 20 times as large as the thicknesses of the magnetic walls.

A distance between the first magnetic wall and the first antenna coil may be not more than the thickness of the first antenna coil, and a distance between the second magnetic wall and the second antenna coil may be not more than the thickness of the second antenna coil.

The magnetic structure may be formed of a ferromagnetic material having a magnetic permeability of not less than 10.

The magnetic structure may further include a third magnetic wall disposed outside the second antenna coil.

The third magnetic wall may be disposed close to the second antenna coil.

The magnetic structure may further include an upper magnetic wall connecting upper surfaces of the second magnetic wall and the third magnetic wall.

An upper side of the first magnetic wall may be inclined toward the first antenna coil, and an upper side of the second magnetic wall may be inclined toward the second antenna coil.

In accordance with another aspect of the inventive concept, there is provided a plasma generating unit comprising an antenna unit including a plurality of antenna coils configured to generate plasma from a process gas, and a magnetic structure including a magnetic wall disposed between the plurality of antenna coils, and wherein the antenna unit includes a first antenna coil having a ring shape, and a second antenna coil disposed outside the first antenna coil and having a ring shape.

An upper end of the magnetic wall may be higher than upper ends of the first antenna coil and the second antenna coil.

The magnetic structure may comprise a first magnetic wall disposed to be closer to the first antenna coil than to the second antenna coil, and a second magnetic wall disposed to be closer to the second antenna coil than to the first antenna coil, and the first magnetic wall and the second magnetic wall may be disposed between the first antenna coil and the second antenna coil.

The first antenna coil and the second antenna coil may be provided at the same height, and the first magnetic wall and the second magnetic wall may be provided at the same height.

The magnetic walls may have a ring shape.

central axes of the magnetic walls and central axes of the antenna coils may be the same.

A distance between the first magnetic wall and the first antenna coil may be not more than the thickness of the first antenna coil, and a distance between the second magnetic wall and the second antenna coil may be not more than the thickness of the second antenna coil.

The magnetic structure may be formed of a ferromagnetic material having a magnetic permeability of not less than 10.

The magnetic structure may further include a third magnetic wall disposed outside the second antenna coil.

The third magnetic wall may be disposed close to the second antenna coil.

The magnetic structure may further include an upper magnetic wall connecting upper surfaces of the second magnetic wall and the third magnetic wall.

An upper side of the first magnetic wall may be inclined toward the first antenna coil, and an upper side of the second magnetic wall may be inclined toward the second antenna coil.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

The above and other aspects, features and advantages of the invention will become apparent from the following description of the following embodiments given in conjunction with the accompanying drawings. However, the inventive concept is not limited to the embodiments disclosed below, but may be implemented in various forms. The embodiments of the inventive concept are provided to make the disclosure of the inventive concept complete and fully inform those skilled in the art to which the inventive concept pertains of the scope of the inventive concept.

Although not defined, all the terms (including technical or scientific terms) used herein may have the same meanings that are generally accepted by the common technologies in the field to which the inventive concept pertains. The terms defined by the general dictionaries may be construed as having the same meanings as those meant in the related technologies and/or the disclosure of the application, and will neither become conceptual nor be construed to be excessively formal even though not clearly defined herein. The terms used herein are provided to describe the embodiments but not to limit the inventive concept.

In the specification, the singular forms include plural forms unless particularly mentioned. The expressions 'comprising' and/or its various conjugated forms, such as 'comprising', which are used in the specification do not exclude existence or addition of one or more compositions, substances, elements, steps, operations, and/or devices. Further, the expressions such as 'including' and 'having' have to be construed in the same way.

Figure 1:
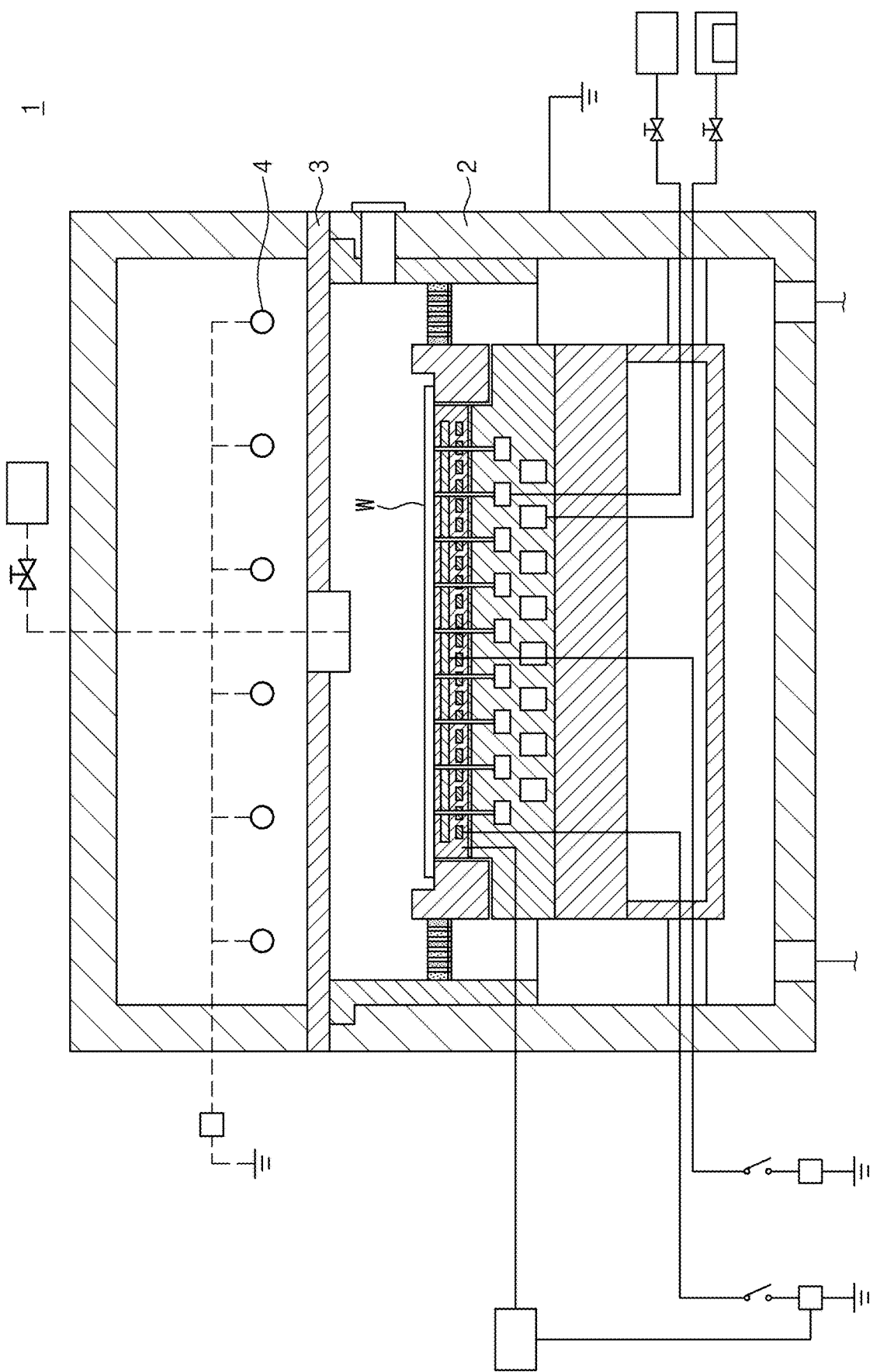
FIG. 1 is a sectional view illustrating a substrate treating apparatus according to the related art.
Figure 2:
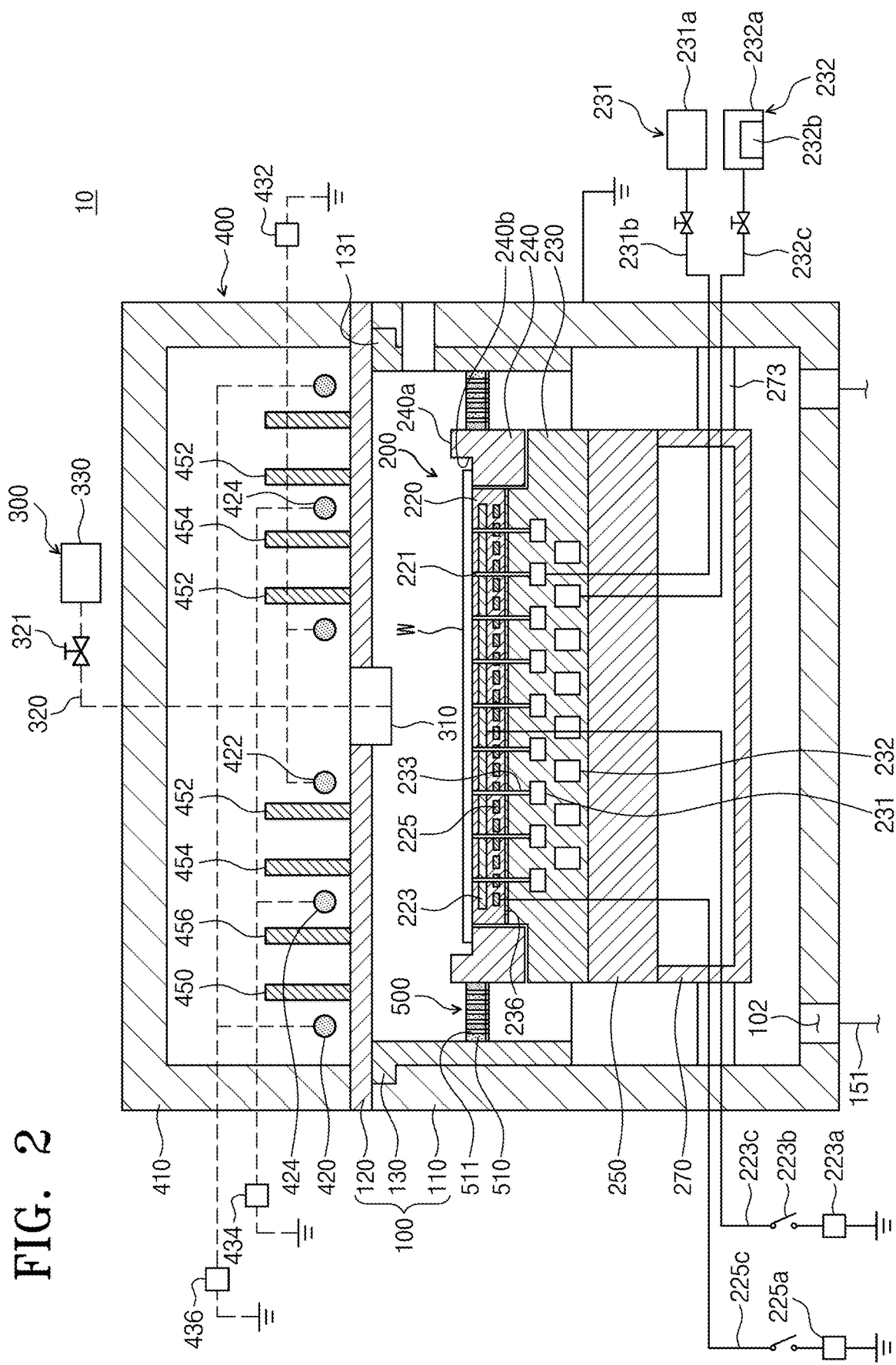
FIG. 2 is a sectional view illustrating the substrate treating apparatus according to the embodiment of the inventive concept.

FIG. 2 is a sectional view illustrating the substrate treating apparatus according to the embodiment of the inventive concept.

Referring to FIG. 2, the substrate treating apparatus 10 treats a substrate W by using plasma. For example, the substrate treating apparatus 10 may perform an etching process on the substrate W. The substrate treating apparatus 10 may include a chamber 100, a support unit 200, a gas supply unit 300, a plasma generating unit 400, and an exhaustion unit 500.

The chamber 100 has a treatment space in which a substrate is treated. The chamber 100 includes a housing 110, a window unit 120, and a liner 130.

The housing 110 has an open-topped space in the interior thereof. The interior space of the housing 110 is provided as a treatment space in which a substrate treating process is performed. The housing 110 is formed of a metallic material. The housing 110 may be formed of aluminum. The housing 110 may be grounded. An exhaust hole 102 is formed on a bottom surface of the housing 110. The exhaust hole 102 is connected to an exhaust line 151. The reaction side-products generated in the process and gases left in the interior space of the housing may be discharged to the outside through the exhaust line 151. Through the exhaustion process, the pressure of the interior of the housing 110 is reduced to a specific pressure.

The window unit 120 covers an opened upper surface of the housing 110. The window unit 120 has a plate shape, and the interior space of the housing 110 is closed. The window unit 120 may include a dielectric window.

The liner 130 is provided in the interior of the housing 110. The liner 130 has an interior space, an upper surface and a lower surface of which are opened. The liner 130 may have a cylindrical shape. The liner 130 may have a radius corresponding to an inner surface of the housing 110. The liner 130 is provided along the inner surface of the housing 110. A support ring 131 is formed at an upper end of the liner 130. The support ring 131 is a ring-shaped plate, and protrudes to the outside of the liner 130 along the circumference of the liner 130. The support ring 131 is positioned at an upper end of the housing 110, and supports the liner 130. The liner 130 may be formed of the same material as the housing 110. The liner 130 may be formed of aluminum. The liner 130 protects the inner surface of the housing 110. In a process of exciting a process gas, arc discharging is generated in the interior of the chamber 100. The arc discharging damages peripheral devices. The liner 130 may prevent an inner surface of the housing 110 from being damaged due to arc discharging by protecting the inner surface of the housing 110. Further, the reaction side-products generated in the substrate treating process are prevented from being deposited on the inner wall of the housing 110. The liner 130 is inexpensive and may be easily exchanged as compared with the housing 110. Accordingly, when the liner 130 is damaged due to arc discharging, the operation may exchange the liner 130 with a new liner 130.

The support unit 200 supports the substrate in the treatment space in the interior of the chamber 100. For example, the support unit 200 is disposed in the interior of the chamber housing 110. The support unit 200 supports the substrate W. The support unit 200 may include an electrostatic chuck that suctions the substrate W by using an electrostatic force. Unlike this, the support assembly 200 may support the substrate W in various methods such as mechanical clamping. Hereinafter, the support unit 200 including the electrostatic chuck will be described.

The support unit 200 includes an electrostatic chuck and a lower cover 270. The support unit 200 may be located in the interior of the chamber 100 to be spaced upwards apart from the bottom surface of the chamber housing 110.

The electrostatic chuck has a body and an insulation plate 250. The body includes an inner dielectric plate 220, an electrode 223, a heater 225, a support plate 230, and a focusing ring 240.

The inner dielectric plate 220 is located at an upper end of the electrostatic chuck. The inner dielectric plate 220 may be formed of a dielectric substance of a disk shape. The substrate W is positioned on an upper surface of the inner dielectric plate 220. The upper surface of the inner dielectric plate 220 has a diameter that is smaller than that of the substrate W. A first supply passage 221 that is used as a passage, through which a heat transfer gas is supplied to a bottom surface of the substrate W, is formed in the inner dielectric plate 220. The electrode 223 and the heater 225 are buried in the inner dielectric plate 220.

The electrode 223 is located above the heater 225. The electrode 223 is electrically connected to a first lower power source 223a. An electrostatic force may be applied between the electrode 223 and the substrate W by a current applied to the electrode 223, and the substrate W may be suctioned to the inner dielectric plate 220 by the electrostatic force.

The heater 225 is electrically connected to a second lower power source 225a. The heater 225 generates heat by a resistance due to a current applied to the second power source 225a. The generated heat is transferred to the substrate W through the inner dielectric plate 220. The substrate W is maintained at a specific temperature by the heat generated by the heater 225. The heater 225 includes a spiral coil. The support plate 230 is located below the inner dielectric plate 220. A bottom surface of the inner dielectric plate 220 and an upper surface of the support plate 230 may be bonded to each other by an adhesive 236.

The support plate 230 has a first circulation passage 231, a second circulation passage 232, and a second supply passage 233. The first circulation passage 231 is provided as a passage, through which the heat transfer gas circulates. The second circulation passage 232 is provided as a passage, through which a cooling fluid circulates. The second passage 233 connects the first circulation passage 231 and the second circulation passage 221. The first circulation passage 231 is provided as a passage, through which the heat transfer gas circulates. The first circulation passage 231 may be formed in the interior of the support plate 230 to have a spiral shape. Further, the first circulation passage 231 may be disposed such that passages having ring shapes of different radii have the same center. The first circulation passages 231 may communicate with each other. The first circulation passages 231 are formed at the same height.

The first circulation passages 231 are connected to a heat transfer medium storage 231a through heat transfer medium supply lines 231b. A heat transfer medium is stored in the heat transfer medium storage 231a. The heat transfer medium includes an inert gas. According to an embodiment, the heat transfer medium includes a helium (He) gas. The helium gas may be supplied to the first circulation passages 231 through supply lines 231b, and may be supplied to the bottom surface of the substrate W after sequentially passing through the second supply passages 233 and the first supply passages 221. The helium gas functions as a medium that helps exchange of heat between the substrate W and the electrostatic chuck 210. Accordingly, the temperature of the substrate W is uniform as a whole.

The second circulation passages 232 are connected to the cooling fluid storage 232a through the cooling fluid supply lines 232c. The cooling fluid storage 232a may store a cooling fluid. A cooler 232b may be provided in the cooling fluid storage 232a. The cooler 232b cools the cooling fluid to a specific temperature. Unlike this, the cooler 232b may be installed on the cooling fluid supply line 232c. The cooling fluid supplied to the second circulation passages 232 through the cooling fluid supply lines 232c cools the support plate 230 while circulating along the second circulation passages 232. The support plate 230 may cool the inner dielectric plate 220 and the substrate W together while being cooled to maintain the substrate W at a specific temperature.

The focusing ring 240 is disposed at a peripheral area of the electrostatic chuck. The focusing ring 240 has a ring shape, and is disposed along the circumference of the inner dielectric plate 220 to support a peripheral area of the substrate W. Because the focusing ring 240 is provided such that an upper peripheral area of the focusing ring 240 protrudes in a ring shape, plasma may be concentrated on the substrate W. The surface of the focusing ring 240 may be formed of a dielectric material. For example, the surface of the focusing ring may be coated with an yttrium oxide ($Y_2O_3$). As the process time increases, the surface of the focusing ring 240 is etched so that the thickness of a layer formed of a dielectric material changes. The changed thickness of the dielectric layer of the surface of the focusing ring 240 influences the process. For example, in the case in which the substrate treating apparatus 10 etches the substrate by using plasma, etching rate decreases if the thickness of the dielectric layer on the surface of the focusing ring 240 becomes smaller. Accordingly, the focusing ring 240 is exchanged with a new focusing ring 240 if the thickness of the dielectric layer on the surface of the focusing ring 240 is not more than a specific thickness.

The insulation plate 250 is located below the support plate 230. The insulation plate 250 is formed of an insulating material, and electrically insulates the support plate 230 and the lower cover 270.

The lower cover 270 is located at a lower end of the support unit 200. The lower cover 270 is spaced upwards apart from the bottom surface of the housing 110. An open-topped space is formed in the interior of the lower cover 270. The upper surface of the lower cover 270 is covered by the insulation plate 250. Accordingly, the outer radius of the section of the lower cover 270 is the same as the outer radius of the insulation plate 250. A lift pin module (not illustrated) that moves the transferred substrate W from a transfer member on the outside to the electrostatic chuck may be located in the interior space of the lower cover 270.

The lower cover 270 has a connecting member 273. The connecting member 273 connects an outer surface of the lower cover 270 and an inner wall of the housing 110. A plurality of connecting members 273 may be provided on an outer surface of the lower cover 270 at a specific interval. The connecting members 273 support the support unit 200 in the interior of the chamber 100. Further, the connecting members 273 are connected to an inner wall of the housing 110 such that the lower cover 270 is electrically grounded. A first power line 223c connected to the first lower power source 223a, a second power line 225c connected to the second lower power source 225a, a heat transfer medium supply line 231b connected to the heat transfer medium storage 231a, and a cooling fluid supply line 232c connected to the cooling fluid storage 232a may extend into the lower cover 270 through the interior space of the connecting member 273.

The gas supply unit 300 supplies a process gas into the treatment space in the interior of the chamber 100. The gas supply unit 300 includes a gas supply nozzle 310, a gas supply line 320, and a gas storage unit 330. The gas supply nozzle 310 is installed at a central portion of the cover 120. An ejection hole is formed on the bottom surface of the gas supply nozzle 310. The ejection hole is located below the cover 120, and supplies the process gas into the interior of the chamber 100. The gas supply unit 320 connects the gas supply nozzle 310 and the gas storage unit 330. The gas supply line 320 supplies the process gas stored in the gas storage unit 330 to the gas supply nozzle 310. A valve 321 is installed in the gas supply line 320. The valve 321 opens and closes the gas supply line 320, and adjusts a flow rate of the process gas supplied through the gas supply line 320.

The plasma generating unit 400 excites the process gas supplied into the treatment space into a plasma state. The plasma generating unit 400 according to the embodiment of the inventive concept may be of an inductively coupled plasma type. The plasma generating unit 400 includes an antenna seal 410, an antenna unit 420, a magnetic structure, and plasma power sources 432, 434, and 436.

The antenna seal 410 has an open-bottomed cylindrical shape. The antenna seal 410 has a space in the interior thereof. The antenna seal 410 has a diameter corresponding to the chamber 100. A lower end of the antenna seal 410 may be detachably provided in the window unit 120. The antenna unit 420 is disposed in the interior of the antenna seal 410.

The antenna unit 420 includes a plurality of antenna coils having a ring shape. As an embodiment, the antenna unit 420 may include a first antenna coil 422 and a second antenna coil 424 disposed outside the first antenna coil 422. As another embodiment, the antenna unit 420 may further include a third antenna coil 426 disposed outside the second antenna coil. However, the antenna unit 420 is not limited to include three antenna coils, but may include more than three antenna coils.

The magnetic structure 450 includes a magnetic wall disposed between the plurality of antenna coils. The magnetic structure 450 may be formed of a ferromagnetic material having a high magnetic permeability. For example, the magnetic permeability of the magnetic structure 45 may be 10 or more. The magnetic structure 450 may include a first magnetic wall 452 and a second magnetic wall 454 disposed between the first antenna coil 422 and the second antenna coil 424, and a third magnetic wall 456 disposed outside the second antenna coil 424. In this case, the first magnetic wall 452 is disposed to be closer to the first antenna coil than to the second antenna coil, and the second magnetic wall 454 is disposed to be closer to the second antenna coil than to the first antenna coil. Further, the third magnetic wall 456 is disposed to be close to the second antenna coil.

The plasma power sources 432, 434, and 436 are RF power sources, and supply RF power to the antenna coils of the antenna unit 420. The plasma power sources 432, 434, and 436 may apply different RF power to the antenna coils 422, 424, and 426. The plasma power sources 432, 434, and 436 may be located outside the chamber 100. The antenna unit 420, to which electric power has been applied, may form an electromagnetic field to the treatment space of the chamber 100. The process gas is excited into a plasma state by an electromagnetic field.

The exhaustion unit 500 is located between an inner wall of the housing 110 and the support unit 200. The exhaustion unit 500 includes an exhaustion plate 510 having a through-hole 511. The exhaustion plate 510 has an annular ring shape. The exhaustion plate 510 has a plurality of through-holes 511. The process gas provided into the housing 110 passes through through-holes 511 of the exhaustion plate 510 and is exhausted through the exhaust hole 102. The flow of the process gas may be controlled according to the shape of the exhaustion plate 510 and the shape of the through-holes 511.

Figure 3:
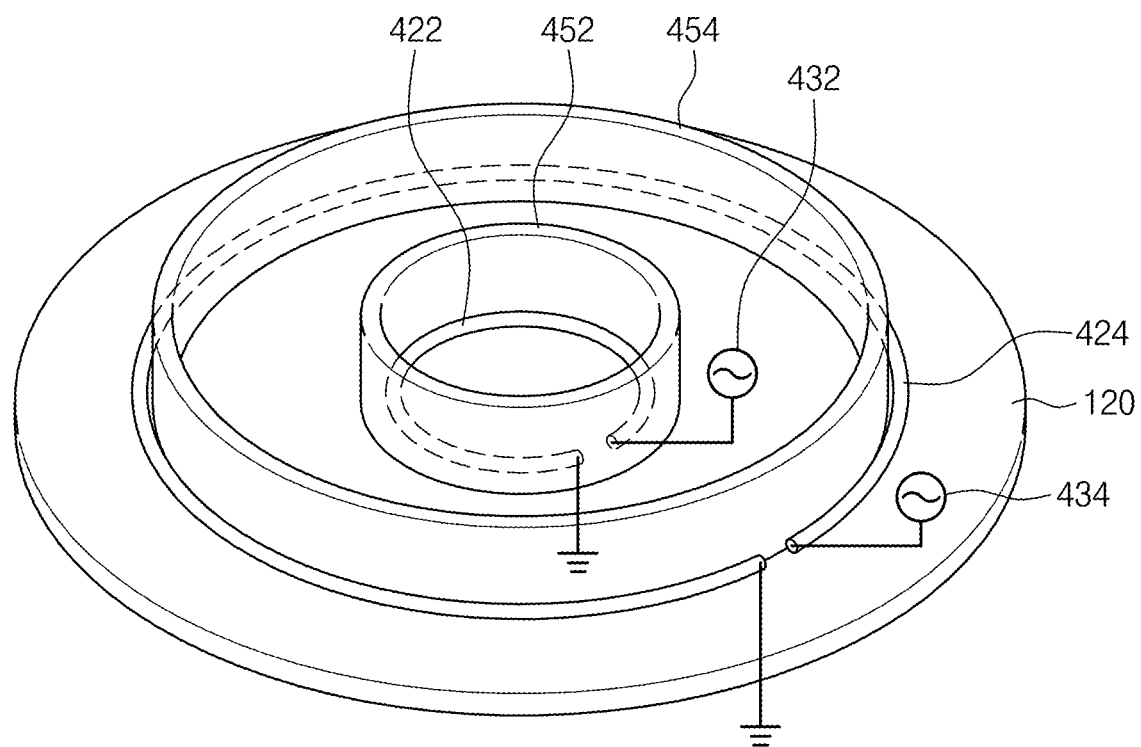
FIG. 3 is a view illustrating a plasma generating unit according to an embodiment of the inventive concept.

FIG. 3 is a view illustrating a plasma generating unit according to an embodiment of the inventive concept.

As illustrated in FIG. 3, the plasma generating unit according to the embodiment of the inventive concept may include a plurality of antenna coils, and a plurality of magnetic walls disposed between the plurality of antenna coils. The plurality of antenna coils have a ring shape, and include a first antenna coil 422, and a second coil 424 disposed outside the first antenna coil 422. The first antenna coil 422 may receive first RF power from the first plasma power source 432, and may receive second RF power from the second plasma power source 434. In this case, the first RF power and the second RF power may be different. A plurality of magnetic walls for shielding mutual coupling of the antenna coils may be disposed between the plurality of antenna coils. The plurality of magnetic walls may be disposed in a ring shape. The plurality of magnetic walls may include a first magnetic wall 452 disposed to be close to the first antenna coil 422, and a second magnetic wall 454 disposed to be close to the second antenna coil 424. As an embodiment, the plurality of antenna coils and the plurality of magnetic walls may have the same central axis. Hereinafter, the disposition structure and relationship of the antenna unit and the magnetic structure according to the inventive concept will be described below with reference to FIGS. 4 to 7.

Figure 4:
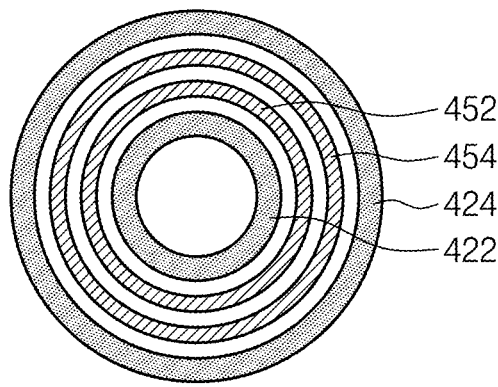
FIG. 4 is a plan view illustrating a disposition structure of an antenna coil and a magnetic wall of the plasma generating unit according to the embodiment of the inventive concept.

FIG. 4 is a plan view illustrating a disposition structure of an antenna coil and a magnetic wall of the plasma generating unit according to the embodiment of the inventive concept.

FIG. 4 is a view illustrating the disposition structure when the antenna unit includes two antenna coils. As illustrated in FIG. 4, when the antenna units include a first antenna coil 422 and a second antenna coil 424, a first magnetic wall 452 and a second magnetic wall 454 are disposed between the first antenna coil 422 and the second antenna coil 424. In this case, the first magnetic wall 452 is disposed to be closer to the first antenna coil 422 than to the second antenna coil 424, and the second magnetic wall 452 is disposed to be closer to the second antenna coil 424 than to the first antenna coil 422.

Figure 5:
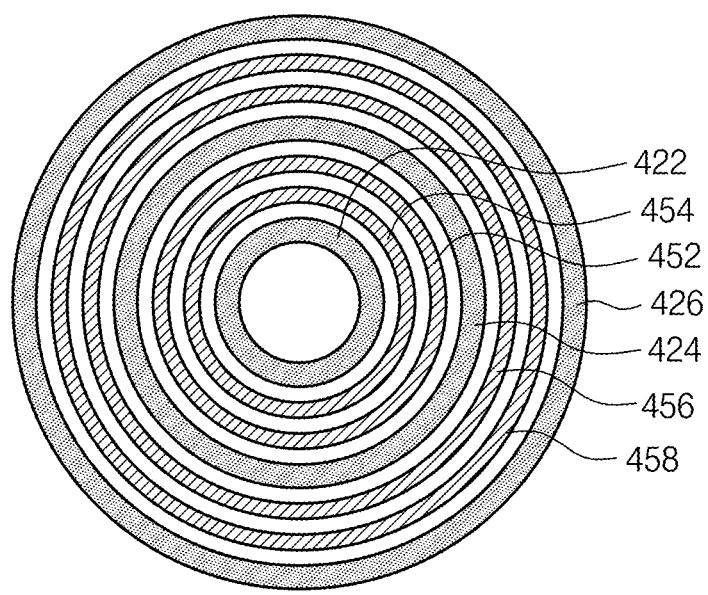
FIG. 5 is a plan view illustrating a disposition structure of an antenna coil and a magnetic wall of the plasma generating unit according to another embodiment of the inventive concept.

FIG. 5 is a plan view illustrating a disposition structure of an antenna coil and a magnetic wall of the plasma generating unit according to another embodiment of the inventive concept.

FIG. 5 is a view illustrating the disposition structure when the antenna unit includes three antenna coils. As illustrated in FIG. 5, when the antenna unit includes a first antenna coil 422, a second antenna coil 424, and a third antenna coil 426, a first magnetic wall 452, a second magnetic wall 454, a third magnetic wall 456, and a fourth magnetic wall 458 may be disposed. The first magnetic wall 452 and the second magnetic wall 454 are disposed between the first antenna coil 422 and the second antenna coil 424, and the third magnetic wall 456 and the fourth magnetic wall 458 are disposed between the third antenna coil 424 and the third antenna coil 426. In this case, the first magnetic wall 452 is disposed to be closer to the first antenna coil 422 than to the second antenna coil 424, and the second magnetic wall 452 is disposed to be closer to the second antenna coil 424 than to the first antenna coil 422. Further, the third magnetic wall 456 is disposed to be closer to the second antenna coil 424 than to the third antenna coil 426, and the fourth magnetic wall 458 is disposed to be closer to the third antenna coil 426 than to the second antenna coil 424.

Figure 6:
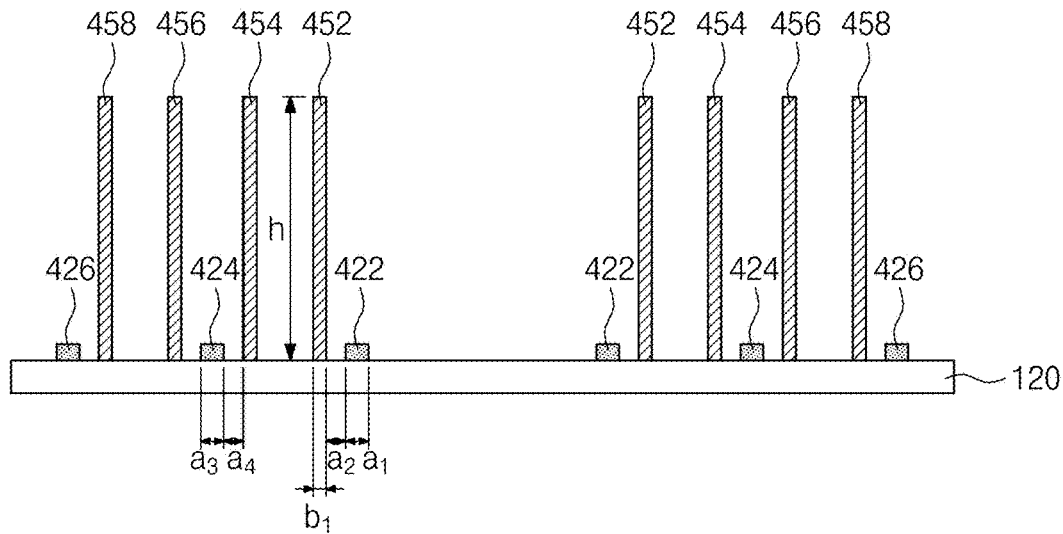
FIG. 6 is a front view illustrating a disposition structure of an antenna coil and a magnetic wall of the plasma generating unit according to the embodiment of the inventive concept.

FIG. 6 is a front view illustrating a disposition structure of an antenna coil and a magnetic wall of the plasma generating unit according to the embodiment of the inventive concept.

As illustrated in FIG. 6, the plasma generating unit according to the embodiment of the inventive concept may include a plurality of antenna coils 422, 424, and 426 and a plurality of magnetic walls 452, 454, 456, and 458. The plurality of antenna coils 422, 424, and 426 and the plurality of magnetic walls 452, 454, 456, and 458 may be disposed on the window unit 120. The plurality of magnetic walls 452, 454, 456, and 458 may have the same height, and the plurality of antenna coils 422, 424, and 426 also may have the same height. The upper ends of the magnetic walls may be higher than the upper ends of the antenna coils. For example, the upper end of the first magnetic wall 452 may be higher than the upper end of the first antenna coil 422, and the upper end of the second magnetic wall 424 may be higher than the upper end of the second antenna coil 424. As an embodiment, the heights h of the magnetic walls may be more than 20 times as large as the thicknesses b1 of the magnetic walls. Further, the distance a1 between the first magnetic wall 452 and the first antenna coil 422 is not more than the thickness a1 of the first antenna coil 422, and the distance a4 between the second magnetic wall 454 and the second antenna coil 424 may be not more than the thickness a3 of the second antenna coil 424. Further, although not illustrated, the plurality of magnetic walls may further include an upper magnetic wall that connects upper surfaces of two magnetic walls that are close to each other while an antenna coil is interposed therebetween. For example, the plurality of magnetic walls may include an upper magnetic wall that connects the upper surfaces of the second magnetic wall 454 and the third magnetic wall 456 that are close to each other while the second antenna coil 424 is interposed therebetween. Accordingly, the plurality of magnetic walls may completely shield a magnetic field due to the second antenna coil 424, thereby preventing mutual coupling with another antenna coil.

Because the antenna unit and the magnetic structure of the plasma generating unit have the above-mentioned disposition structure, an influence of the mutual coupling of the antenna coils may be shielded more effectively, and accordingly, the antenna coils may be independently removed.

Figure 7:
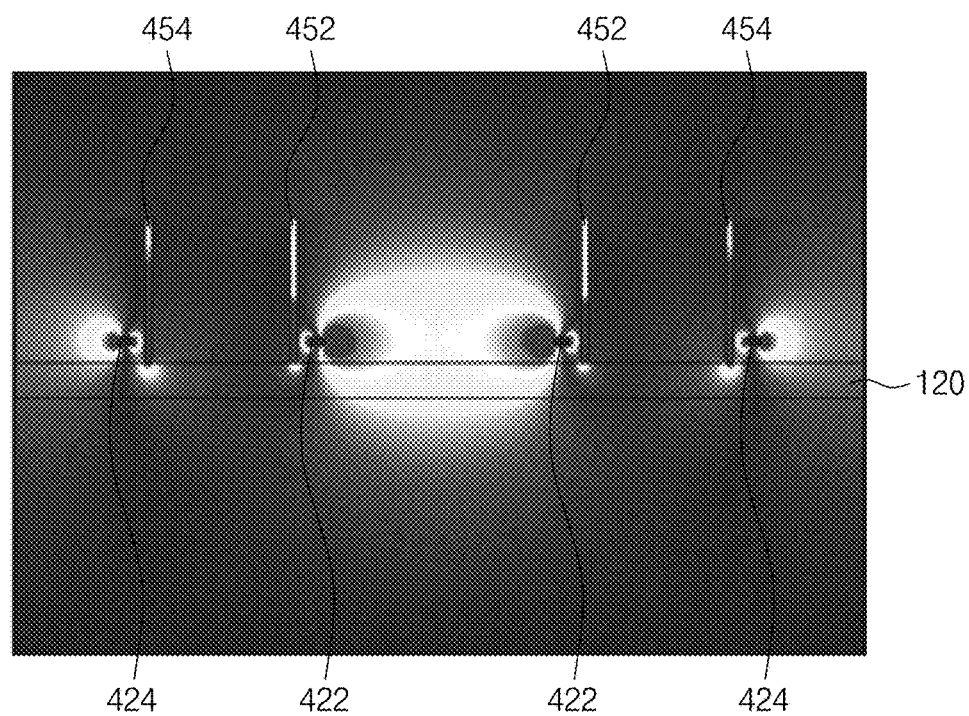
FIG. 7 is a view illustrating distribution of magnetic fields of a plasma generating unit according to an embodiment of the inventive concept.

FIG. 7 is a view illustrating distribution of magnetic fields of a plasma generating unit according to an embodiment of the inventive concept.

FIG. 7 is a view illustrating distribution of magnetic fields due to the first antenna coil 422 and the second antenna coil 424 when the first magnetic wall 452 and the second magnetic wall 454 are disposed between the first antenna coil 422 and the second antenna coil 424 to be close to the antenna coils according to an embodiment of the inventive concept. As illustrated in FIG. 7, it may be identified that a magnetic field due to the first antenna coil 422 and a magnetic field due to the second antenna coil 424 may be shielded from each other by the first magnetic wall 452 and the second magnetic wall 454 not to influence each other.

Figure 8:
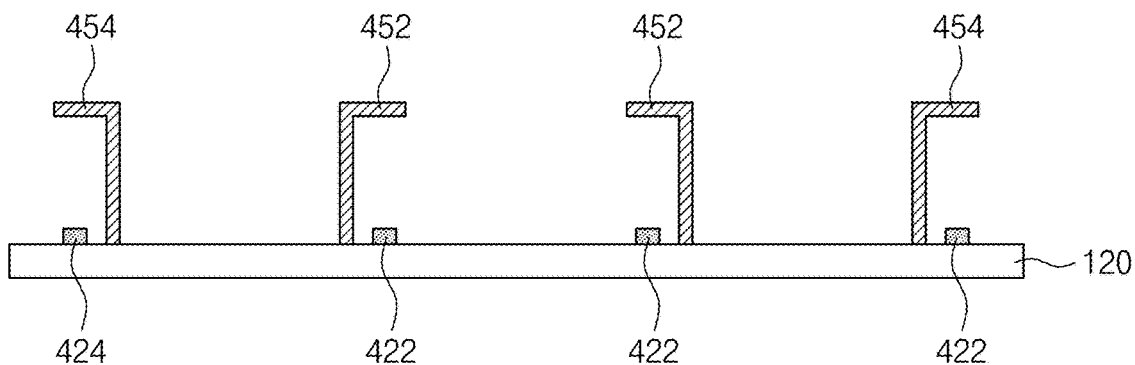
FIGS. 8 to 10 are views illustrating a structure of a magnetic wall according to another embodiment of the inventive concept.
Figure 9:
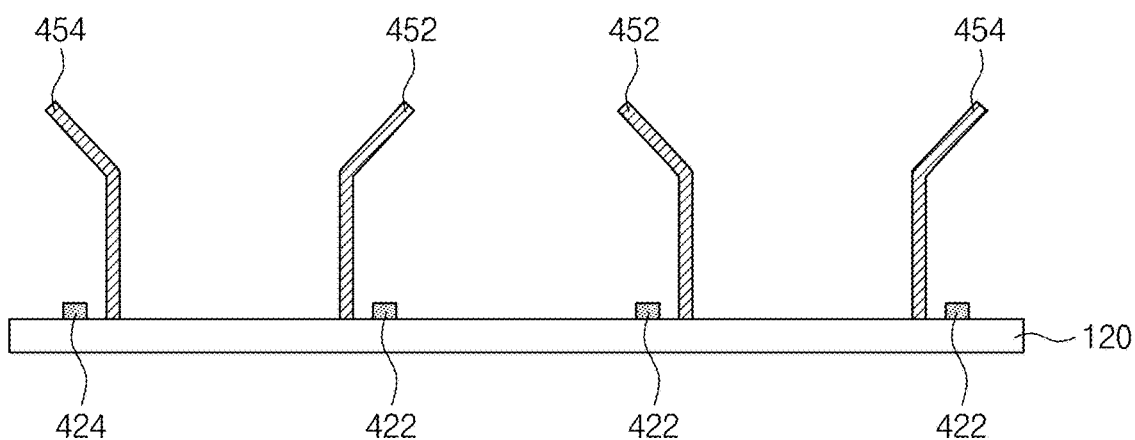
Figure 10:
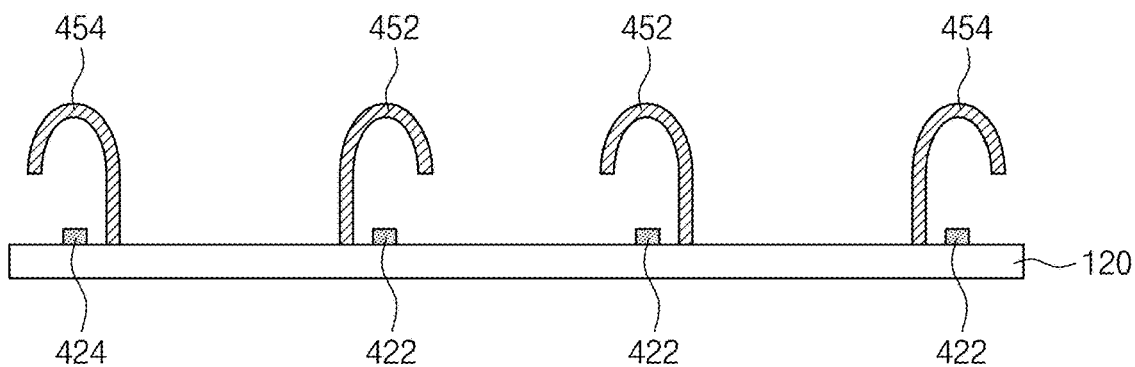

FIGS. 8 to 10 are views illustrating a structure of a magnetic wall according to another embodiment of the inventive concept.

As illustrated in FIGS. 8 to 10, the magnetic wall according to the second embodiment of the inventive concept may be provided such that an upper side of the magnetic wall is inclined toward an antenna coil that is close to the magnetic wall. As an embodiment, as illustrated in FIG. 8, an upper side of the first magnetic wall 452 may be inclined at the right angle toward the antennal coil 422. As another embodiment, as illustrated in FIG. 9, an upper side of the first magnetic wall 452 may be inclined at about 45° toward the antennal coil 422. As another embodiment, as illustrated in FIG. 10, an upper side of the first magnetic wall 452 may be inclined in a hook shape toward the antennal coil 422.

Figure 11:
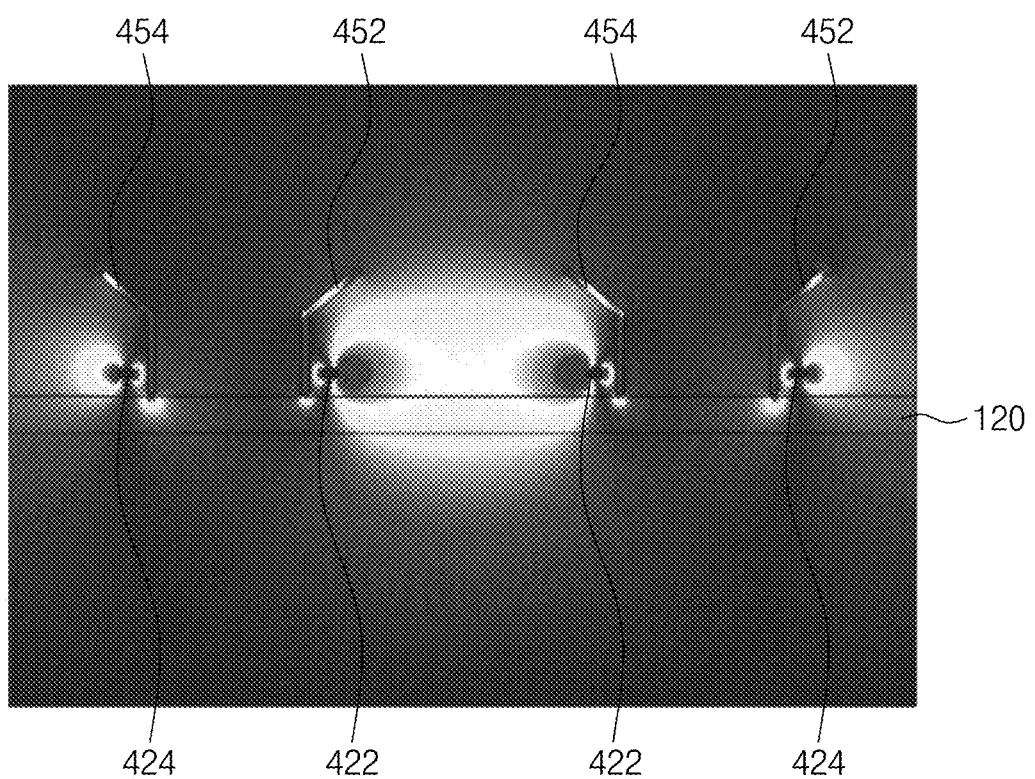
FIG. 11 is a view illustrating distribution of magnetic fields of a plasma generating unit according to another embodiment of the inventive concept.

FIG. 11 is a view illustrating distribution of magnetic fields of a plasma generating unit according to another embodiment of the inventive concept.

FIG. 11 is a view illustrating distribution of magnetic fields due to the first antenna coil 422 and the second antenna coil 424 when the upper sides of the first magnetic wall 452 and the second magnetic wall 454 disposed between the first antenna coil 422 and the second antenna coil 424 to be close to the antenna coils are inclined toward the first antenna coil 422 and the second antenna coil 424. As illustrated in FIG. 11, it may be identified that a magnetic field due to the first antenna coil 422 and a magnetic field due to the second antenna coil 424 may be shielded from each other by the first magnetic wall 452 and the second magnetic wall 454 not to influence each other. Further, it may be identified that the magnetic fields due to the antenna coils may be shielded more effectively than the case in which the magnetic walls are linear because the magnetic walls surround the magnetic fields due to the antenna coils as the upper sides of the first magnetic wall 452 and the second magnetic wall 454 are inclined toward the first antenna coil 422 and the second antenna coil 424.

According to the embodiment of the inventive concept, an influence due to the mutual coupling of the plurality of coils provided in the plasma generating unit may be reduced and the coils may be independently controlled. Accordingly, the density of the plasma of the plasma generating unit may be uniformly formed.

The effects of the prevent invention are not limited the above-mentioned ones. Unmentioned effects will be clearly understood from the specification and the accompanying drawings by those skilled in the art to which the inventive concept pertains.

It is noted that the above embodiments are suggested for understanding of the inventive concept and do not limit the scope of the inventive concept, and various modifiable embodiments also fall within the scope of the inventive concept. It should be understood that the technical protection range of the inventive concept has to be determined by the technical spirit of the claims, and the technical protection range of the inventive concept is not limited to the lexical meaning of the claims but reaches even to the equivalent inventions.

What is claimed is:

1. A substrate treating apparatus comprising:
a process chamber having a treatment space in the interior thereof and a cover covering an upper opening of the process chamber;
a substrate support unit configured to support a substrate in the treatment space;
a gas supply unit configured to supply a process gas into the treatment space; and
a plasma generating unit disposed outside the process chamber and configured to generate plasma from the process gas in the process chamber,
wherein the plasma generating unit comprises:
an antenna unit including a plurality of antenna coils configured to generate plasma from the process gas; and
a magnetic structure, and
wherein the antenna unit comprises:
a first antenna coil having a ring shape; and
a second antenna coil disposed outside the first antenna coil and having a ring shape, and
wherein the magnetic structure comprises:
a first magnetic wall disposed on the cover and to be closer to the first antenna coil than to the second antenna coil; and
a second magnetic wall disposed on the cover and to be closer to the second antenna coil than to the first antenna coil and to be beside the second antenna coil,
wherein the first magnetic wall and the second magnetic wall are disposed between the first antenna coil and the second antenna coil so that a magnetic field due to the first antenna coil and a magnetic field due to the second antenna coil are shielded from each other by the first magnetic wall and the second magnetic wall,
wherein the first magnetic wall and the first antenna coil are spaced apart by a distance and the distance between the first magnetic wall and the first antenna coil is not more than the thickness of the first antenna coil,
wherein the second magnetic wall and the second antenna coil are spaced apart by a distance and the distance between the second magnetic wall and the second antenna coil is not more than the thickness of the second antenna coil, and
wherein an upper end of the first magnetic wall is inclined in a hook shape toward the first antennal coil, and an upper end of the second magnetic wall is inclined in a hook shape toward the second antennal coil.

2. The substrate treating apparatus of claim 1, wherein the upper ends of the first and second magnetic walls are higher than upper ends of the first antenna coil and the second antenna coil.

3. The substrate treating apparatus of claim 1, wherein the upper end of the first magnetic wall is higher than an upper end of the first antenna coil.

4. The substrate treating apparatus of claim 1, wherein the upper end of the second magnetic wall is higher than an upper end of the second antenna coil.

5. The substrate treating apparatus of claim 4, wherein the first antenna coil and the second antenna coil are provided at the same height, and wherein the first magnetic wall and the second magnetic wall are provided at the same height.

6. The substrate treating apparatus of claim 4, wherein the first and second magnetic walls have a ring shape.

7. The substrate treating apparatus of claim 6, wherein central axes of the first and second magnetic walls and central axes of the antenna coils are the same.

8. The substrate treating apparatus of claim 1, wherein the heights of the first and second magnetic walls are more than 20 times as large as the thicknesses of the magnetic walls.

9. The substrate treating apparatus of claim 1, wherein the first and second magnetic structure are formed of a ferromagnetic material having a magnetic permeability of not less than $10\mu/\mu_0$.

10. The substrate treating apparatus of claim 1, wherein the magnetic structure further includes:
a third magnetic wall disposed outside the second antenna coil.

11. The substrate treating apparatus of claim 10, wherein the magnetic structure further includes:
an upper magnetic wall connecting upper surfaces of the second magnetic wall and the third magnetic wall.

12. A plasma generating unit for a process chamber comprising:
an antenna unit including a plurality of antenna coils configured to generate plasma from a process gas; and
a magnetic structure, and
wherein the antenna unit comprises:
a first antenna coil having a ring shape; and
a second antenna coil disposed outside the first antenna coil and having a ring shape, and
wherein the magnetic structure comprises:
a first magnetic wall disposed on a cover of the process chamber and to be closer to the first antenna coil than to the second antenna coil; and
a second magnetic wall disposed on the cover of the process chamber and to be closer to the second antenna coil than to the first antenna coil and to be beside the second antenna coil,
wherein the first magnetic wall and the second magnetic wall are disposed between the first antenna coil and the second antenna coil so that a magnetic field due to the first antenna coil and a magnetic field due to the second antenna coil are shielded from each other by the first magnetic wall and the second magnetic wall,
wherein the first magnetic wall and the first antenna coil are spaced apart by a distance and the distance between the first magnetic wall and the first antenna coil is not more than the thickness of the first antenna coil,
wherein the second magnetic wall and the second antenna coil are spaced apart by a distance and the distance between the second magnetic wall and the second antenna coil is not more than the thickness of the second antenna coil, and
wherein an upper end of the first magnetic wall is inclined in a hook shape toward the first antennal coil, and an upper end of the second magnetic wall is inclined in a hook shape toward the second antennal coil.

13. The plasma generating unit of claim 12, wherein the upper ends of the first and second magnetic wall are higher than upper ends of the first antenna coil and the second antenna coil.

14. The plasma generating unit of claim 12, wherein the first antenna coil and the second antenna coil are provided at the same height, and
  wherein the first magnetic wall and the second magnetic wall are provided at the same height.

15. The plasma generating unit of claim 12, wherein the first and second magnetic walls have a ring shape.

16. The plasma generating unit of claim 12, wherein the magnetic structure further includes:
  a third magnetic wall disposed outside the second antenna coil.

17. The plasma generating unit of claim 16, wherein the magnetic structure further includes:
  an upper magnetic wall connecting upper surfaces of the second magnetic wall and the third magnetic wall.

\* \* \* \* \*